United States Patent
Caldwell et al.

(10) Patent No.: US 8,866,497 B2
(45) Date of Patent: Oct. 21, 2014

(54) APPARATUS AND METHOD FOR DETERMINING A TOUCH INPUT

(75) Inventors: David W. Caldwell, Holland, MI (US); William D. Schaefer, Grand Rapids, MI (US)

(73) Assignee: AlSentis, LLC, Holland, MI (US)

(*) Notice: Subject to any disclaimer, the term of this patent is extended or adjusted under 35 U.S.C. 154(b) by 505 days.

(21) Appl. No.: 13/259,567

(22) PCT Filed: Mar. 24, 2010

(86) PCT No.: PCT/US2010/028461
§ 371 (c)(1),
(2), (4) Date: Nov. 28, 2011

(87) PCT Pub. No.: WO2010/111362
PCT Pub. Date: Sep. 30, 2010

(65) Prior Publication Data
US 2012/0068760 A1  Mar. 22, 2012

Related U.S. Application Data

(60) Provisional application No. 61/163,237, filed on Mar. 25, 2009.

(51) Int. Cl.
*G01R 27/26* (2006.01)
*G06F 3/041* (2006.01)
*G06F 3/044* (2006.01)

(52) U.S. Cl.
CPC ............ *G06F 3/044* (2013.01); *G06F 3/0418* (2013.01); *G01R 27/2605* (2013.01); *G06F 3/41* (2013.01)
USPC ............ 324/658; 324/686; 324/661; 345/173

(58) Field of Classification Search
USPC ............... 324/658, 649, 600, 519, 661, 686; 702/47, 52; 73/304 C, 718, 724, 780, 73/335.04, 514.32, 862.337, 862.626; 340/562, 545.4; 345/174, 173
See application file for complete search history.

(56) References Cited

U.S. PATENT DOCUMENTS 5,594,222 A  1/1997  Caldwell
5,760,715 A  6/1998  Senk et al.
(Continued)

FOREIGN PATENT DOCUMENTS

EP  1 881 605  1/2008
WO  2006/115946  11/2006

OTHER PUBLICATIONS

International Search Report, International Application No. PCT/US10/28461, May 24, 2010.
(Continued)

*Primary Examiner* — Hoai-An D Nguyen
(74) *Attorney, Agent, or Firm* — Warner Norcross & Judd LLP (57) ABSTRACT

A capacitive sensor for detecting a stimulus. The capacitive sensor includes an electrode and a processing unit electrically coupled to the electrode and configured to determine the presence of a stimulus based on the rate of change of the electrode capacitance. A substrate is positioned adjacent the electrode, wherein the stimulus corresponds to the placement of an object against the substrate. The processing unit is operative to determine a time rate of change based on successive measurements of the electrode capacitance. In addition, the processing unit is operative to determine the presence of a stimulus in response to the time rate of change being less than a reference value.

30 Claims, 11 Drawing Sheets

(56) References Cited

U.S. PATENT DOCUMENTS

| | | |
|---|---|---|
| 6,310,611 B1 | 10/2001 | Caldwell |
| 6,320,282 B1 | 11/2001 | Caldwell |
| 6,466,036 B1 | 10/2002 | Philipp |
| 6,713,897 B2 | 3/2004 | Caldwell |
| 7,009,663 B2 | 3/2006 | Abileah et al. |
| 7,030,513 B2 | 4/2006 | Caldwell |
| 7,218,498 B2 | 5/2007 | Caldwell |
| 7,746,325 B2 | 6/2010 | Roberts |
| 7,920,134 B2 | 4/2011 | Krah |
| 8,111,243 B2 | 2/2012 | Peng et al. |
| 8,144,132 B2 * | 3/2012 | Chen et al. ............... 345/174 |
| 8,169,416 B2 * | 5/2012 | Han ............... 345/173 |
| 2003/0063073 A1 | 4/2003 | Geaghan et al. |
| 2003/0067451 A1 | 4/2003 | Tagg et al. |
| 2003/0206162 A1 | 11/2003 | Roberts |
| 2003/0215976 A1 | 11/2003 | Chou et al. |
| 2005/0253596 A1 | 11/2005 | Kitano et al. |
| 2006/0267953 A1 | 11/2006 | Peterson, Jr. et al. |
| 2007/0229466 A1 | 10/2007 | Peng et al. |
| 2008/0122798 A1 * | 5/2008 | Koshiyama et al. ......... 345/173 |
| 2010/0117981 A1 * | 5/2010 | Chen et al. ............... 345/174 |
| 2010/0295813 A1 | 11/2010 | Kent |
| 2011/0043227 A1 * | 2/2011 | Pance et al. ............... 324/681 |
| 2011/0084937 A1 | 4/2011 | Chang et al. |
| 2011/0254672 A1 | 10/2011 | Ciesla et al. |
| 2011/0279406 A1 * | 11/2011 | Kawaguchi et al. ......... 345/174 |
| 2011/0279408 A1 | 11/2011 | Urano et al. |
| 2012/0001859 A1 * | 1/2012 | Kim et al. ............... 345/173 |
| 2012/0062516 A1 | 3/2012 | Chen et al. |
| 2012/0068957 A1 | 3/2012 | Puskarich et al. |
| 2012/0075239 A1 | 3/2012 | Azumi et al. |
| 2012/0092324 A1 | 4/2012 | Buchan et al. |
| 2013/0050126 A1 * | 2/2013 | Kimura et al. ............... 345/173 |

OTHER PUBLICATIONS

Written Opinion, International Application No. PCT/US10/28461, May 24, 2010.

* cited by examiner

APPARATUS AND METHOD FOR DETERMINING A TOUCH INPUT

This application claims priority from provisional U.S. Application No. 61/163,237 filed Mar. 25, 2009, and entitled "Time Domain Differential Sensing."

FIELD OF THE INVENTION

The present invention relates to an apparatus and method for sensing a touch input on a touch surface, and more particularly, to an electronic circuit and method for detecting a touch input.

BACKGROUND OF THE INVENTION

Touch inputs on a touch surface are widely used as an input methodology. Touch inputs may be best known in conjunction with appliance control panels, smart phones and other handheld devices. However, touch screens and touch inputs are gaining widespread acceptance as a user interface over a wide variety of applications. It is also important that a touch surface have an appropriate sensitivity to touch. If the surface is "too sensitive," it may be susceptible to noise, or it may register false touches. If the surface is "too insensitive," it may not accurately register desired touches, or fail to register a touch altogether.

Capacitance sensing has been well established as a method of detecting a variety of stimuli, including touch inputs, with an improved sensitivity to touch. Capacitive sensors normally require at least one electrical element typically referred to as an electrode, element, or plate. In some instances, there may be one, two or more networks of capacitive electrodes, elements or plates. These elements are geometrically designed to cause the formation of a net electric field in both a non-stimulus state as well as a stimulus state.

Many methods of generating an output based on the difference between a non-stimulus state and a stimulus state are known in the art. According to one known method, a capacitive sensor is provided which includes at least one electrode. The electrode can be geometrically designed to detect a change in capacitance due to a stimulus, e.g., the presence of a nearby object. A measuring circuit converts the output of the electrode into a voltage, current, frequency, period or pulse width that is linearly or non-linearly proportional to the change in capacitance of the electrode. The electronic measuring circuit then evaluates the change in capacitance against a predetermined reference value. A change in capacitance in excess of the predetermined reference value indicates the proximity of the object to the capacitive sensor.

Problems with the aforementioned method include: (1) inability to compensate for dielectric variations among different objects; (2) susceptibility to environmental conditions; (3) inability to compensate for manufacturing tolerances and variations in component materials; and (4) when configured as a touch sensor, inability to detect an input at the touch surface without respect to whether a finger is gloved or not. In an attempt to overcome the aforementioned problems, known measuring circuits typically average the capacitive output over a variety of non-stimulus conditions to achieve a desired reference value. The resulting reference value can then be used to determine if there is sufficient proportional change (as described above) to indicate the presence of a valid stimulus. However, the determination of an averaged or compensated reference value often requires processing in software or a devoted microcontroller, which in turn can add cost and unneeded complexity to the overall system. Even with averaging algorithms, some variation, such as increased touch substrate thickness, can not be adequately compensated for to eliminate sensitivity variations.

Figure 1:
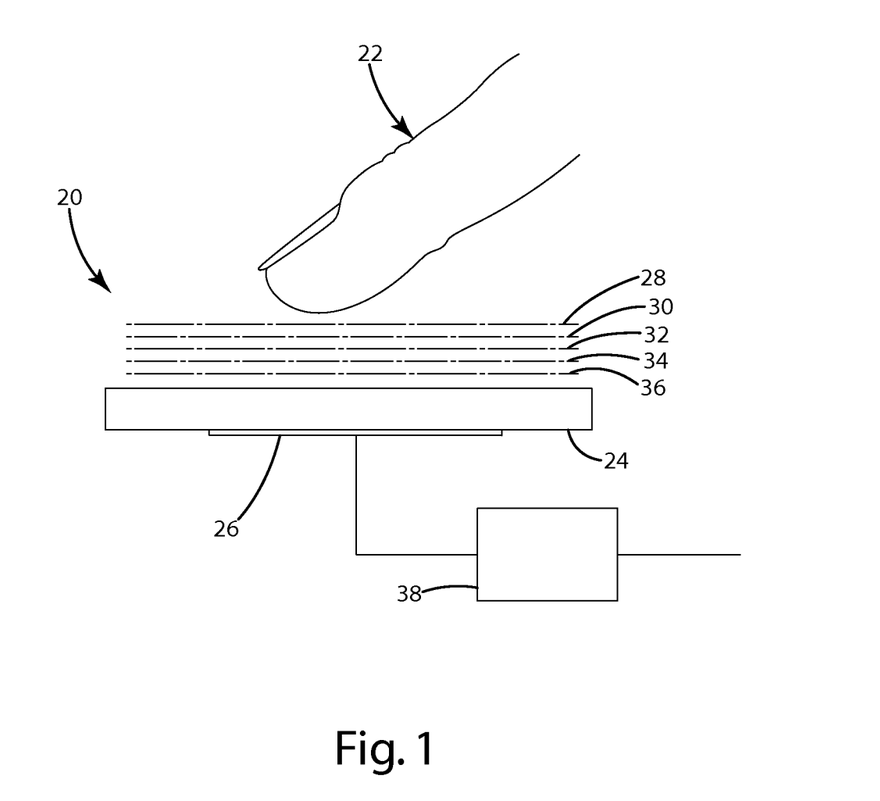
FIG. 1 is a representation of a capacitive sensor and an associated measurement circuit.

For example, consider a capacitive sensor 20 provided to sense a human finger 22 against a given substrate 24 as shown in FIG. 1. As the finger 22 is brought towards the substrate 24, it approaches an electrode 26 with varying degrees of proximity 28, 30, 32, 34, 36. Once the finger 22 has approached and moved to a first distance 28, the electrode 26 and the corresponding measurement circuit 38 will attempt to detect the stimulus as described above with an output that is proportional to the stimulus. At this first distance, the finger is effectively far enough from the electrode 26 that there is effectively no stimulus condition. As the finger 22 approaches the substrate, however, the measurement circuit 38 evaluates the degree of stimulus against the predetermined reference value to determine the presence or absence of a valid stimulus. To account for variations in the environment, several reference values can be set to best identify a valid stimulus event. However, such a system would have to account for a number of factors, including the composition and variation of the construction materials, the variances in thickness of the different materials, the manufacturing processes and variances of the bonding of these materials, the dimensional tolerances of the electrode(s) dimensions, and the sensitivity preferences of the user. Alternatively, prior art systems can average the capacitive output over a variety of non-stimulus conditions to achieve a single, compensated reference value. However, the determination of a compensated reference value can be costly and impractical, requiring processing in software or a devoted microcontroller, and potentially delaying the response time of the associated capacitive sensor, and ultimately may not be able overcome sensitivity variations or detect valid stimuli such as a gloved or ungloved finger when the capacitive sensor is configured as a touch sensor.

SUMMARY OF THE INVENTION

The aforementioned problems are overcome by the present invention in which a touch input is determined by monitoring the rate of change of the position of a stimulus, such as a finger, with respect to a touch surface. A touch is determined when the rate of change falls below a minimum, presumably when the stimulus engages the surface.

In the disclosed embodiment, the apparatus includes a capacitive sensor having an electrode and a processing unit electrically coupled to the electrode and configured to determine the presence of a stimulus based on the rate of change of the electrode capacitance. The apparatus can further include a substrate adjacent the electrode, wherein the stimulus corresponds to the placement of an object against or near the substrate. The processing unit is configured to determine the presence of a stimulus in response to the rate of change of the electrode capacitance being less than a first predetermined value, and in response to the absolute value of the electrode capacitance being greater than a second predetermined value.

In another aspect of the invention, a method for detecting a stimulus is provided. The method includes providing a capacitive sensor, the capacitive sensor including an output, measuring a rate of change of the capacitive sensor output, and determining the presence of a stimulus based on the rate of change of the capacitive sensor output. The method further includes determining an object has come to rest with respect to the capacitive sensor based on the rate of change of the capacitive sensor being less than a first reference value. The measuring step includes detecting, over successive sampling intervals, a variation in the capacitive sensor output, and the stimulus can correspond to a metal sensor (e.g., an RPM sensor) adjacent the capacitive sensor or the placement of an object against a substrate overlying the capacitive sensor.

These and other features and advantages of the present invention will become apparent from the following description of the invention, when viewed in accordance with the accompanying drawings and appended claims.

DETAILED DESCRIPTION OF THE CURRENT EMBODIMENT

The invention as contemplated and disclosed herein can greatly improve the performance of capacitive sensors over known capacitive sensing systems and methods. In particular, the system and method set forth below utilizes the rate of change of a capacitive sensor output, the absolute value of which remains positive as an object approaches the capacitive sensor from some distance away, and which rapidly declines as the object comes to rest relative to the capacitive sensor.

For example, consider again FIG. 1, which depicts a human finger 22 as moving toward a touch substrate 24, a capacitive sensor 26 and an associated measurement circuit 38. As the finger 22 is positioned at a first distance 28 relative to the substrate 24, the finger 22 is far enough from the capacitive sensor 26 that there is effectively no stimulus condition. If the finger 22 were moved closer at a second distance 30, there would be a slight amount of capacitive change at the capacitive sensor 26 and therefore a proportional change detected by the measurement circuit 38. If the finger 22 were moved to third or fourth distances 32, 34, there is an even greater insertion of capacitive change based on the closer proximity to the capacitive sensor 26. In addition, as the finger 22 approaches the capacitive sensor 26, the absolute value of the rate of change of the sensor output has remained positive.

However, as the finger comes to rest against the substrate 24 overlying the capacitive sensor 26, the rate of change of the capacitive sensor output with respect to time (ds/dt) will fall to zero, or nearly zero. Of course, as the finger 22 comes into contact with the substrate 24, ds/dt may continue to remain positive until the fingertip 22 has come to rest and conformed itself to the substrate surface under greater pressure from the user. If, however, the finger 22 comes into contact and then immediately comes to rest with very little pressure exerted, ds/dt can drop significantly. In each instance, the measurement circuit 38 can provide an output based on ds/dt to indicate the finger has impacted the touch substrate 24. Though described as movement normal to the touch substrate 24, the measurement circuit 100 is equally suited to provide an output in response to movement of an object along, or parallel to, the touch substrate 24.

Figure 2:
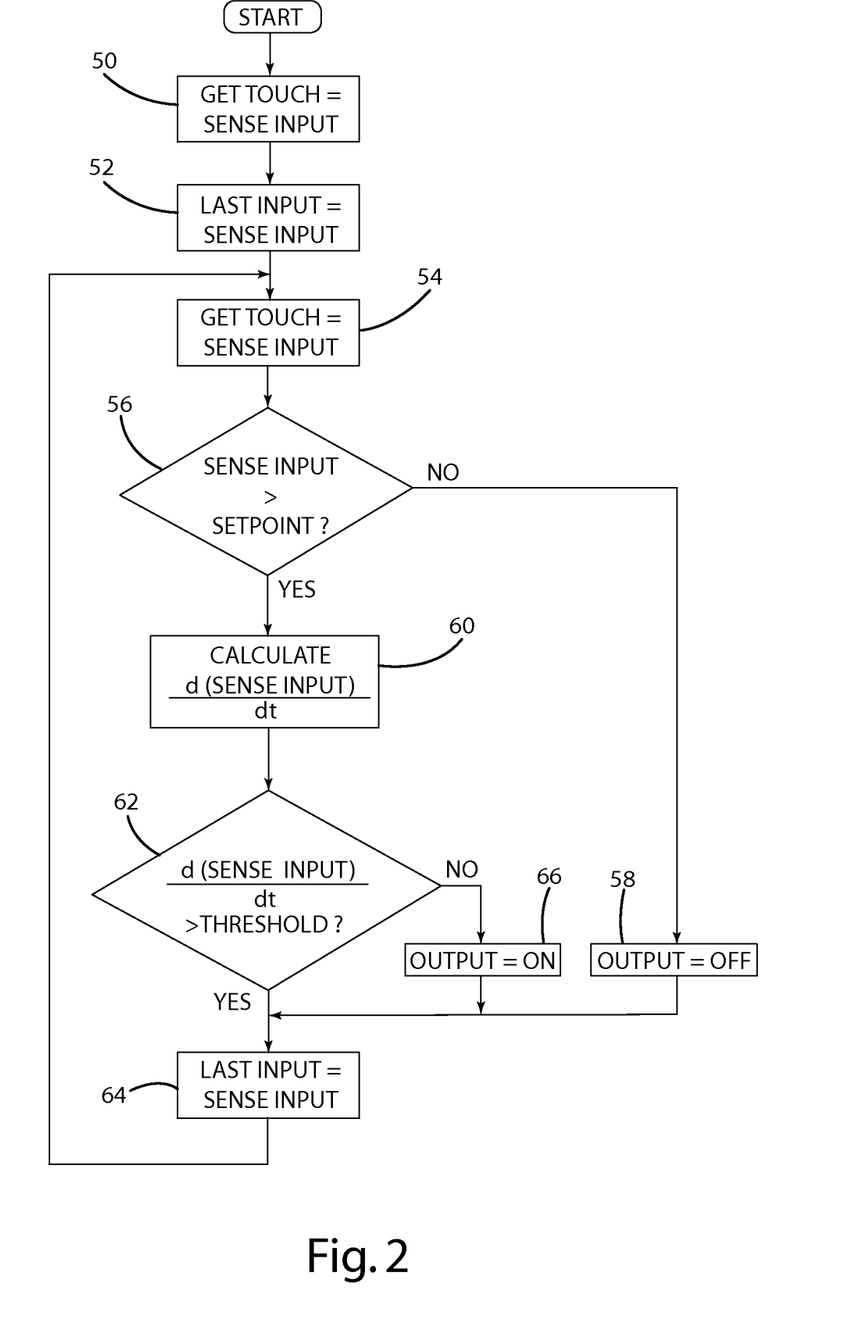
FIG. 2 is flow chart showing the control flow an embodiment of the present invention.

With reference to FIG. 2, there is shown a block diagram for a method of generating an output to indicate a valid stimulus in accordance with an embodiment of the present invention. The method includes measuring the output of a capacitive sensor, or "Sense Input," at step 50 and at time $T_1$. The Sense Input is then latched or stored at step 52 as a "Last Input" for future rate of change calculations. Step 54 indicates the start of a continuous control loop, including the step of measuring the output of a capacitive sensor at step 54 at time $T_2$. At step 56, the Sense Input from time $T_2$ is compared with a Setpoint value. The Setpoint value corresponds to a proximity zone within which valid inputs are allowed, and can be loosely set to provide a reset for toggling the output off in the absence of a valid stimulus. That is, the Setpoint is set to correspond to a distance above the substrate surface 24. For example, if the Sense Input at time $T_2$ does not exceed the Setpoint at step 56, the object is estimated to be outside or beyond the proximity zone, and the output is "off" at step 58. If, however, the Sense Input exceeds the Setpoint value at step 56, then the object is estimated to be within the proximity zone. In this instance, ds/dt is determined at step 60 by determining the difference between the Sense Input at time $T_2$ and the Last Input at time $T_1$ (ds), and for a given period (dt) of the continuously operating control loop. The faster an object moves toward the capacitive sensor, the greater the value of ds/dt. Conversely, the slower the object approaches the capacitive sensor, the lower the value of ds/dt. At step 62, ds/dt is compared against a Threshold value. If ds/dt exceeds the Threshold value at step 62, the process resumes at step 64 by latching the Sense Input from time $T_2$ as the Last Input. If, however, ds/dt falls below the Threshold value at step 62, an output is generated at step 66 to indicate the object has come to rest, or has nearly come to rest, with respect to the capacitive sensor. In the same manner, the object can be determined to have receded from the capacitive sensor if ds/dt falls below the Threshold value at step 62 and if the Sense Input is subsequently determined to be less than the Setpoint value at step 56.

It should be noted that alternative embodiments of the method disclosed above may also be utilized. In one embodiment, for example, processing steps 50 and 52 are omitted. In this embodiment, the method commences by determining the Sense Value at step 54 and at time $T_1$. In the absence of a valid Last Input for time $T_0$, the results of the first iteration of the control loop are simply ignored. In this aspect, the Sense Input from time $T_1$ is stored as the Last Input in step 64 for comparison with the Sense Input from time $T_2$ in the second iteration of the control loop. In still another embodiment, decision step 56 and process step 58 are omitted. In this embodiment, the presence or absence of a valid stimulus condition is determined based on the output of decision step 62, i.e., ds/dt with respect to a Threshold value. Alternatively, the presence or absence of a valid stimulus condition can be determined based on the value of ds/dt irrespective of a Threshold value. In this example, the transition from a positive ds/dt to a negative ds/dt can indicate a valid touch input (e.g., an object briefly in contact with a touch substrate). Alternatively, the output of process block 60 over successive scan intervals can be compared against a target profile for determining the presence or absence of a valid stimulus condition, or for distinguishing between different stimulus conditions. Alternatively, the output of process block 60 can be compared with a maximum value to discriminate against noise and electrostatic discharge. In the same manner, the method disclosed above can include an additional decision block (not shown) to compare the output of process block 60 with a minimum value to discriminate against slow variations in capacitance caused by changes in ambient temperature or humidity, for example. Accordingly, the present invention provides a method for determining a valid stimulus condition based on ds/dt, both alone and in combination with one or more reference values and across a variety of applications.

Figure 3A:
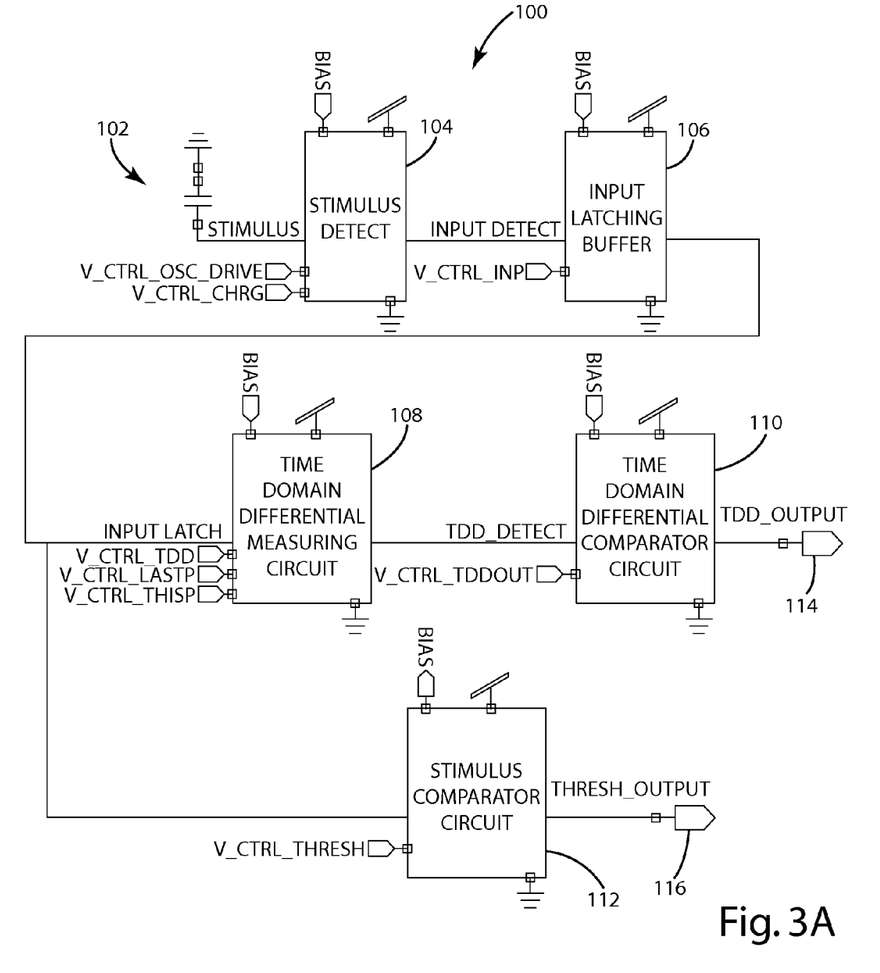
FIG. 3A-3B are functional block diagrams of a measurement and timing interface circuit in accordance with an embodiment of the present invention.
Figure 3B:
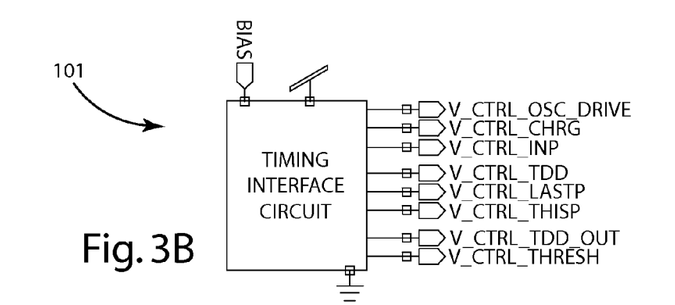

A measurement circuit 100 and a timing interface circuit 101 for a capacitive sensor in accordance with an embodiment of the present invention is shown in FIGS. 3A-3B. The measurement circuit 100 set forth in FIG. 3A is only one example of an integrated circuit used for determining the presence of a proximate object based on the rate of change of a capacitive sensor output with respect to time (ds/dt). With reference to FIG. 3A, the measurement circuit 100 is illustrated in functional terms as including the following sub-units: a Stimulus Detect circuit 104 for detecting a change in the output of a capacitive sensor 102; an Input Latching Buffer 106 for latching and buffering the Stimulus Detect 104 output; a Time Domain Differential Measuring Circuit 108 to determine the rate of change of the capacitive sensor output with respect to time (ds/dt); a Time Domain Differential Comparator Circuit 110 to compare a value proportional to ds/dt against a first predetermined reference value; and a Stimulus Comparator Circuit 112 to compare a value proportional to the capacitive sensor output against a second predetermined reference value. In addition, a timing interface circuit 101 is shown in FIG. 3B for providing the control signals for the measurement circuit 101 as discussed below in connection with FIG. 10. The timing interface circuit 101 as shown in FIG. 3B includes a bias output, a rail voltage input, a connection to ground, and a series of electrical connections to each of the corresponding sub-units of the measurement circuit 100. Though not shown, the timing interface circuit 101 can also include an input for receiving a start-up signal, for example a pulse waveform.

Returning now to FIG. 3A, the measurement circuit 100 includes first and second digital outputs 114, 116 corresponding to the output of decision steps 62 and 56, respectively, as described above in connection with FIG. 2. In particular, the first digital output 114, labeled as TDD_OUTPUT, is a value to indicate whether a value proportional to ds/dt exceeds a first reference value. Similarly, the second digital output 116, labeled as THRESH_OUTPUT, is a value to indicate whether a value proportional to the capacitive sensor output exceeds a second reference value. Accordingly, the outputs 114, 116 can be utilized in digital logic in connection with the method discussed above in connection with FIG. 2 to determine presence of a proximate object. In addition, though shown in FIGS. 3A-3B as an analog embodiment, it should be noted that the functionality of either or both of the measurement circuit 100 and the timing circuit 101 can be similarly implemented using a microcontroller in digital logic using known software methods. For example, utilizing a microcontroller, a capacitive output can be measured using comparators with counters, analog to digital converts and other various means as is known in the art.

Figure 4:
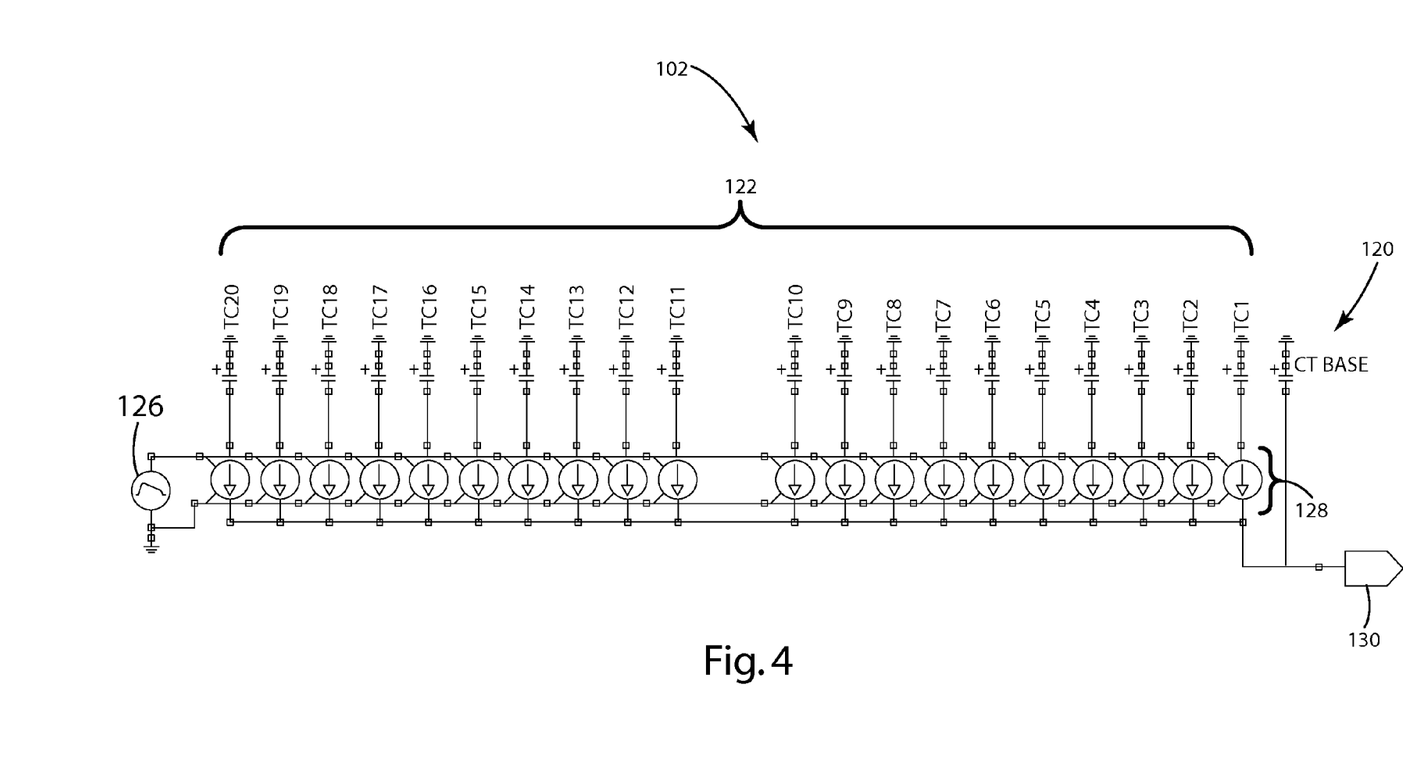
FIG. 4 is a circuit diagram of the capacitive sensor 102 of the measurement circuit of FIG. 3A.
Figure 11:
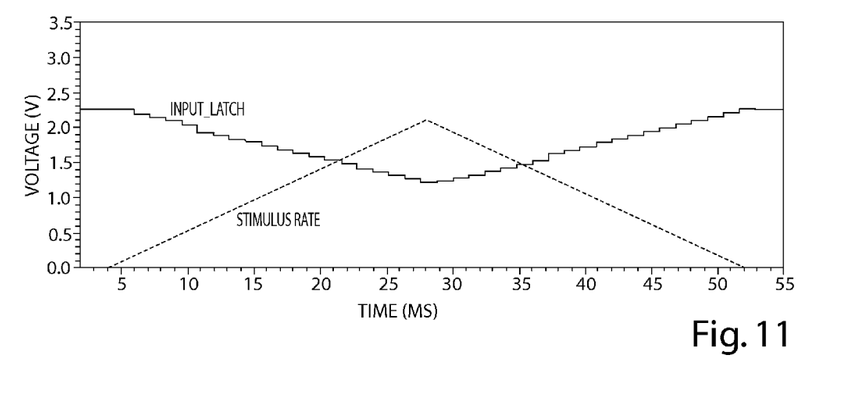
FIG. 11 is a voltage versus time graph illustrating the Input Latch and Stimulus Rate of the measurement circuit of FIG. 3A.

With reference to FIG. 4, a capacitive sensor 102 is provided to model the change in capacitance corresponding to movement of an object toward and away from the capacitive sensor. The capacitive sensor 104 in FIG. 4 is selected to include a primary electrode 120 (0.1 pF) electrically coupled to a series of secondary electrodes 122 (0.01 pF). The primary electrode 120 represents a base capacitance with no stimulus. To simulate the movement of an object toward the capacitive sensor 102, an oscillator 126 actuates a series of voltage controlled switches 128 in 1.2 ms intervals to incrementally add to the capacitance of the capacitive sensor 102 similar to the manner in which an approaching object can increase the capacitance of the capacitive sensor. Because the oscillator waveform is a ramp waveform as shown in FIG. 11, the oscillator also incrementally decreases the capacitance of the capacitive sensor 102 similar to the manner in which a receding object can return the capacitance of the capacitive sensor to nominal levels. In the present embodiment, the oscillator waveform includes a peak voltage of 2.0V and a rise time of approximately 24 ms to approximate the minimum period in which a human finger can approach the capacitive sensor 102 from beyond the effective range of the electrodes 120, 122. In addition, the oscillator 126 is not physically part of the capacitive sensor 102, and is instead used to for the convenience of illustrating how capacitance is inserted in the capacitive sensor by a proximate object. As one of ordinary skill in the art will appreciate, the capacitive sensor of FIG. 4 could alternatively be represented by a variable capacitor. Again, the particular capacitive sensor 102 shown in FIG. 4 is selected for illustrative purposes, and the measurement circuit 100 of the present invention can be utilized in conjunction with any capacitive sensor 102 having an output.

Figure 5:
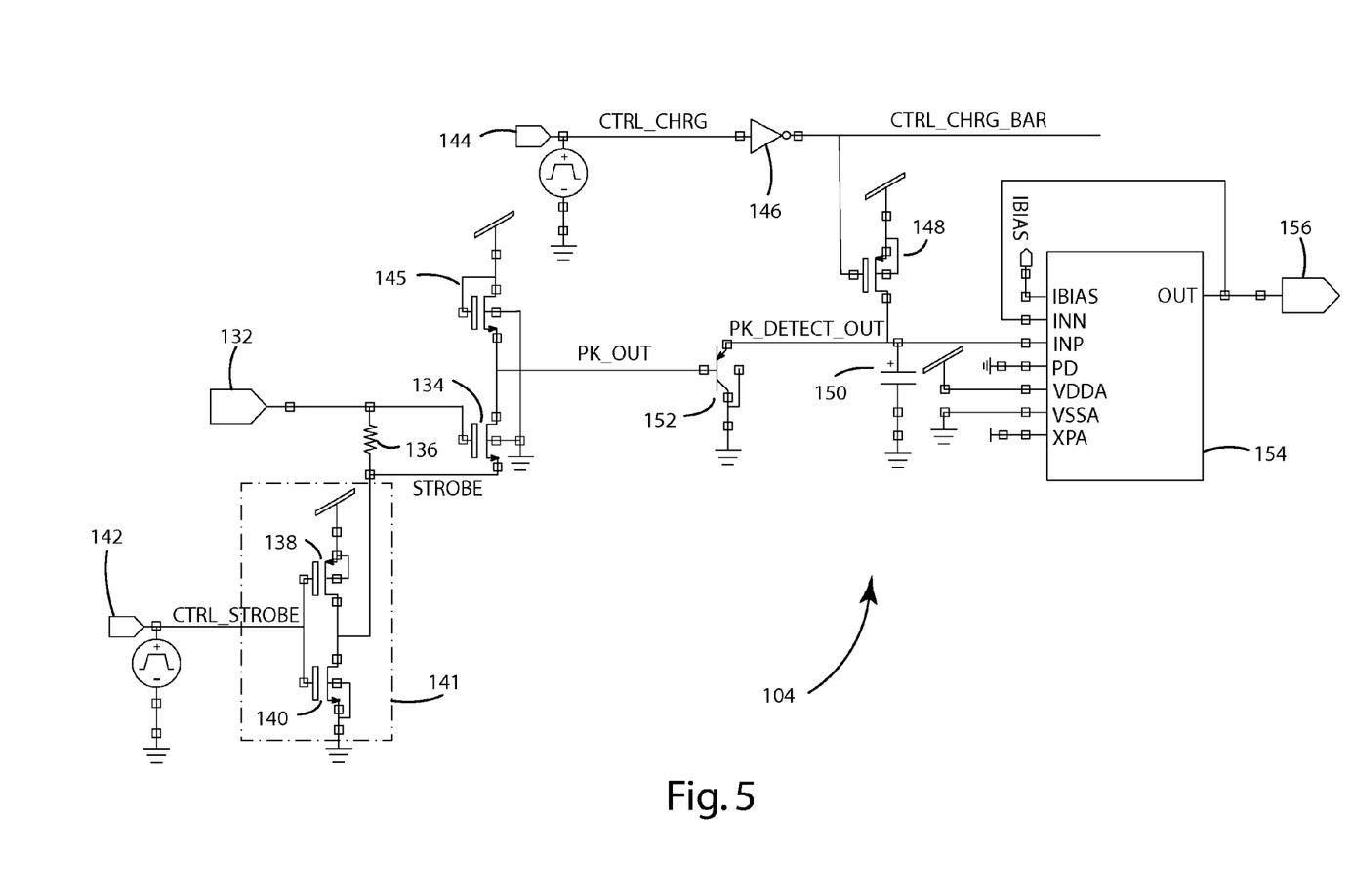
FIG. 5 is a circuit diagram of the stimulus detect circuit 104 of the measurement circuit of FIG. 3A.

Referring now to FIG. 5, a Stimulus Detect circuit 104 is provided for detecting the output of a capacitive sensor 102. While the particular circuit is discussed below in connection with FIG. 5, it should be noted that any Stimulus Detect circuit 104 operable to detect the output of a capacitive sensor 102 may also be utilized. The Stimulus Detect circuit 104 in FIG. 5 includes an input 132 that is electrically coupled to the gate terminal of an N-MOS active device 134, as well as to the source terminal of the N-MOS active device 134 through a 4 kΩ low-impedance load 136. Voltage values in the input terminal 132 are selectively monitored by applying a control-strobe waveform (labeled CTRL_STROBE) to the respective gate terminals of series coupled P-MOS active device 138 and N-MOS active device 140. The resulting push-pull drive 141 is connected to the source terminal of the N-MOS active device 134, and to a terminal of low-impedance load 136. In addition, a Control-Charge input 144 applies a strobe waveform (labeled CTRL_CHRG) across an inverter 146 to the gate terminal of a P-MOS active device 148 to pull capacitive device 150 to 3.3V. The Control-Charge waveform is applied a predetermined period prior to the Control-Strobe waveform. The 1.0 pF sample and hold capacitor 150 is connected between the drain terminal of the P-MOS active device 148 and ground to collect a charge proportional to the output of the capacitive sensor 102. PNP transistor 152 and sample and hold capacitor 150 are configured as a negative peak detector, which stores a voltage proportional to the capacitive output of the capacitive sensor 102. This voltage stored in capacitor 150 is provided as the input to a buffer 154. Buffer 154 is a unity gain operational amplifier including electrical connections to rail voltage (VDDA), ground (VSSA), bias (IBIAS), positive input (INP) and negative input (INN). In addition, PD and XPA can be used to disable the op-amp, which is shown as continuously on in the present embodiment. As shown, the buffer 154 provides a low impedance output 156 to the Input Latching Buffer 106.

Figure 6:
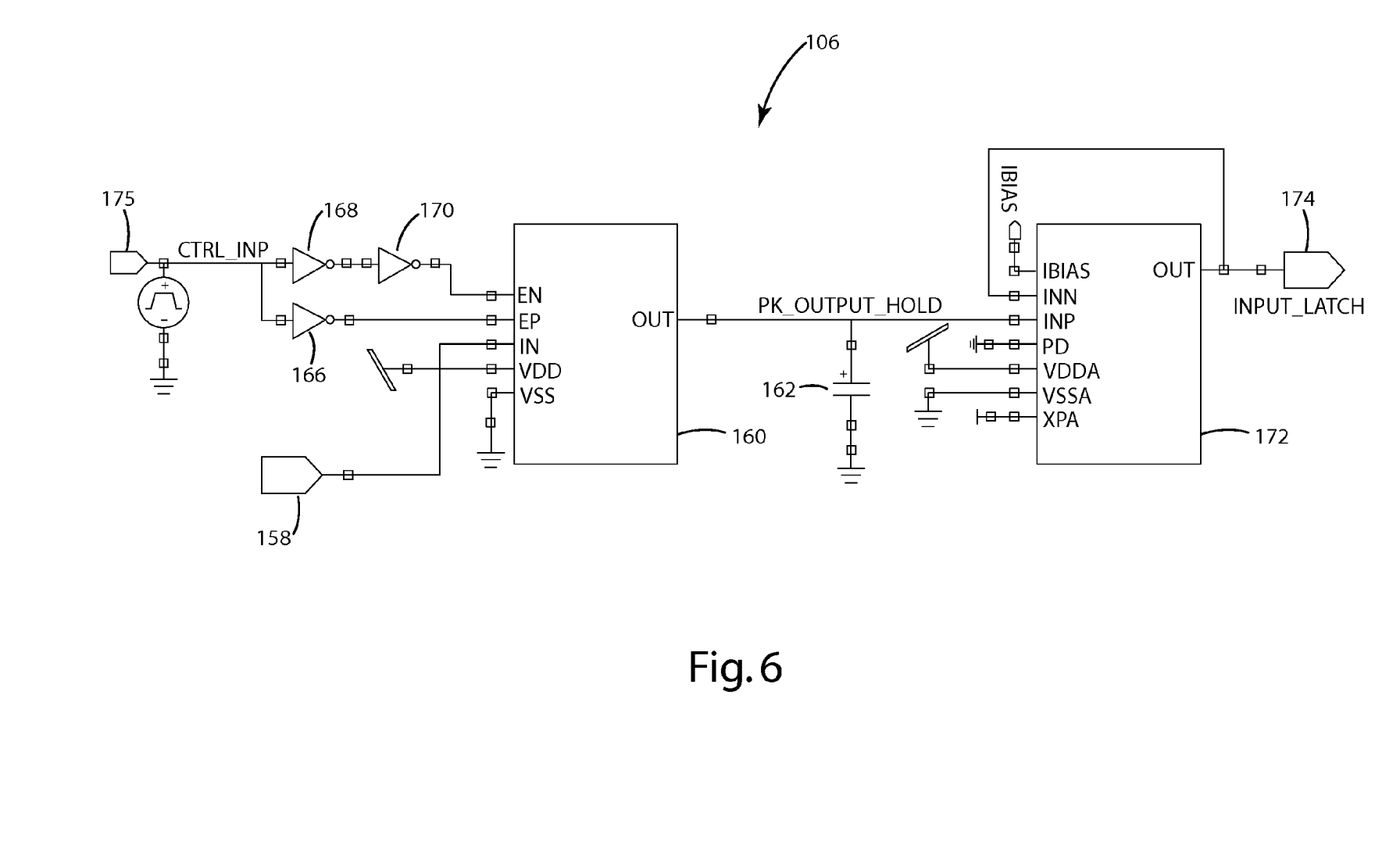
FIG. 6 is a circuit diagram of the input latching buffer 106 of the measurement circuit of FIG. 3A.

Referring now to FIG. 6, the low impedance Stimulus Detector output 156 is electrically coupled to the input terminal 158 of the Input Latching Buffer 106. As noted above, the Input Latching Buffer 106 operates to buffer the Stimulus Detect output 156 for pass through to the Time Domain Differential Measurement Circuit 108 and the Stimulus Comparator Circuit 112. The Input Latching Buffer input 158 is electrically coupled to a transmission gate 160, which operates to pass the input voltage to a 0.5 pF sample and hold capacitor 162. The transmission gate 160 operates via a control signal (labeled as CTRL_INP) through inverters 166, 168 and 170. Transmission gate 160 includes electrical connections to rail voltage (VDD), ground (VSS), and EN and EP which control operation of the transmission gate 160. If the control signal is high, e.g., EN is positive and EP is negative, the transmission gate operates to pass the input voltage to the sample and hold capacitor 162. If the control signal is low, e.g., EN is negative and EP is positive, the transmission gate does not pass the input voltage to the sample and hold capacitor 162. Accordingly, the control signal provides a 3.3V, 3 μs strobe waveform to selectively transfer the output of Stimulus Detect circuit 104 to the sample and hold capacitor 162. This voltage stored in capacitor 162 is provided as the input to a buffer 172. Buffer 172 is operable to prevent the Input Latching Buffer 106 from loading subsequent circuits or otherwise interfering with their operation, and provides a power gain to the Input Latching Buffer output 174. In the same manner as discussed above in connection with buffer 154, buffer 174 is a unity gain operational amplifier including electrical connections to rail voltage (VDDA), ground (VSSA), bias (IBIAS), positive input (INP) and negative input (INN).

Figure 7:
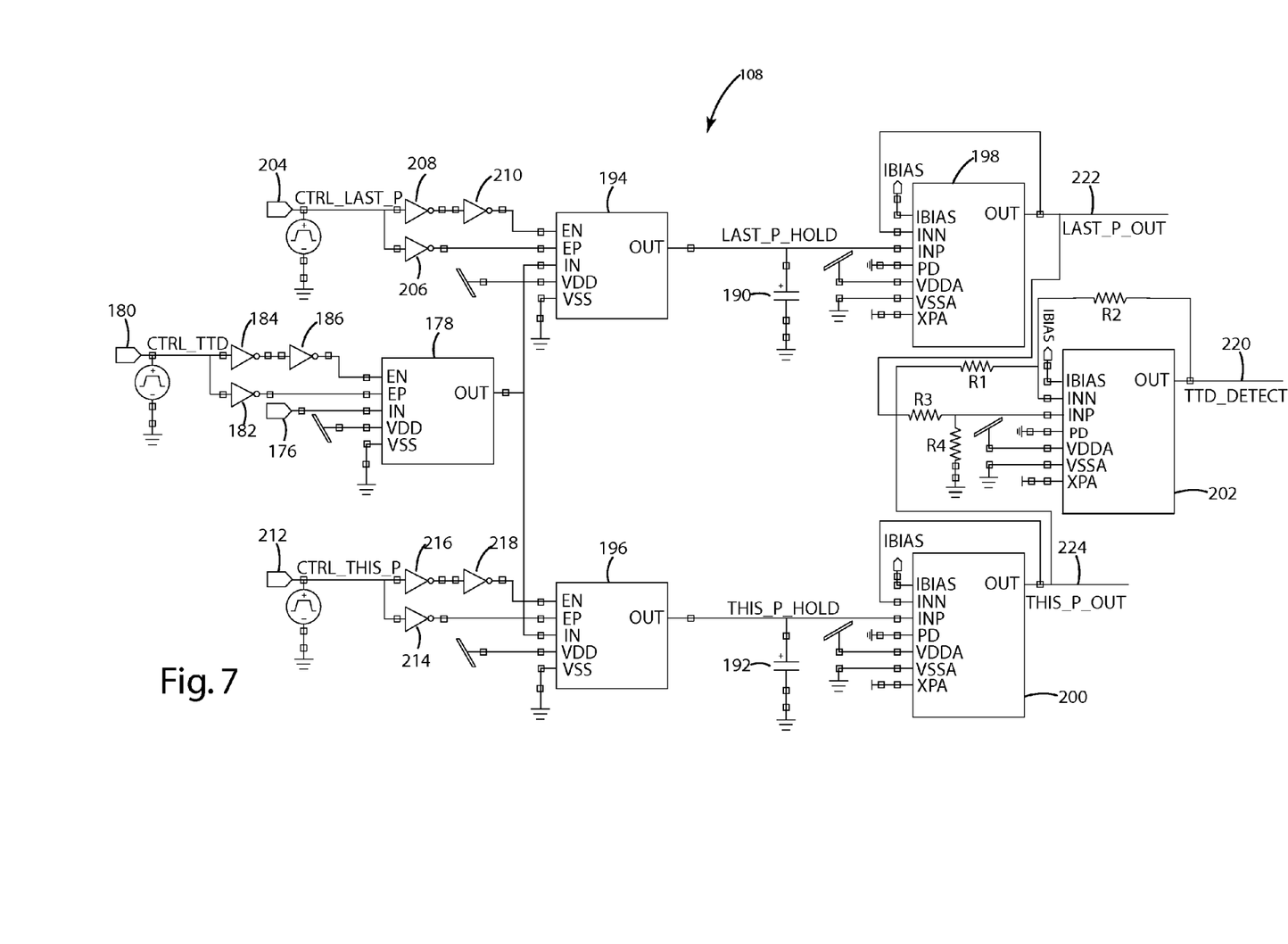
FIG. 7 is a circuit diagram of the first time domain differential latching buffer 108 of the measurement circuit of FIG. 3A.

The output terminal 174 of the Input Latching Buffer 106 is electrically coupled to the input terminal 176 of the Time Domain Differential Measuring Circuit 108. As noted above, the Time Domain Differential Measuring Circuit 108 operates to determine ds/dt between successive iterations of the applicable control loop. Referring now to FIG. 7, the input of the Time Domain Differential Measuring Circuit 108 is electrically connected to a pass through transmission gate 178, which in turn is operated via an always-on control signal (labeled CTRL_TDD). The transmission gate 178 operates to pass the input voltage to 0.5 pF sample and hold capacitors 190, 192, and to effectively isolate the transmission gate 178 output from the input terminal 176. The transmission gate 178 as optionally shown is suited for potential applications where there are multiple inputs to the Time Domain Differential Measurement Circuit 108. The transmission gate 178 is not required, for example, where only one capacitive sensor is measured. As also shown in FIG. 7, the voltage(s) stored in sample and hold capacitors 190 and 192 are provided as the input to buffers 198 and 200, respectively. In the same manner as discussed above, each buffer 198, 200 in the Time Domain Differential Measurement Circuit 108 is a unity gain operational amplifier including electrical connections to rail voltage (VDDA), ground (VSSA), bias (IBIAS), positive input (INP) and negative input (INN). The output for the "last pass" buffer 198 (labeled LAST_P_OUT) is applied to a differential amplifier 202 as the positive or non-inverting input (INP). Similarly, the output for the "this pass" buffer 200 (labeled THIS_P_OUT) is applied to the differential amplifier 202 as the negative or inverting input (INN). Accordingly, the differential amplifier output is proportional to the change between the input voltage 176 over successive samples. In operation, the timing interface circuit 101 applies a transmission gate control signal (labeled as CTRL_LAST_P) via terminal 204 and inverters 206, 208, 210 to transmission gate 194 at time $T_1$ to effectively pass the Input Latch output 174 to the "last pass" sample and hold capacitor 190. The resulting voltage stored on capacitor 190 (labeled as LAST_P_HOLD) corresponds to the Last Input in process step 64 of FIG. 2. At time $T_2$, the timing interface circuit 101 applies a transmission gate control signal (labeled as CTRL_THIS_P) via terminal 212 and inverters 214, 216, 218 to the transmission gate 196 to effectively pass the Input Latch output 174 to the "this pass" sample and hold capacitor 192. The resulting voltage stored on capacitor 192 (labeled as THIS_P_HOLD) corresponds to the Sense Input in process step 54 of FIG. 2. As described above, the corresponding voltages (LAST_P_HOLD and THIS_P_HOLD) are buffered through operational amplifiers 198, 200, respectively, and transferred to differential amplifier 202. When resistive loads R1=R3 and R2=R4, the differential amplifier output (labeled as TDD_DETECT) is determined according to the following formula:

$$TDD\_DETECT = R2/R1 * (LAST\_P\_OUT - THIS\_P\_OUT)$$

In addition, it should be noted that resistive loads R1, R2, R3, R4 are constant and can be preselected according to the desired sensitivity. The resulting output TDD_DETECT is therefore proportional to the rate of change of the capacitive sensor output with respect to time (k*ds/dt).

Figure 8:
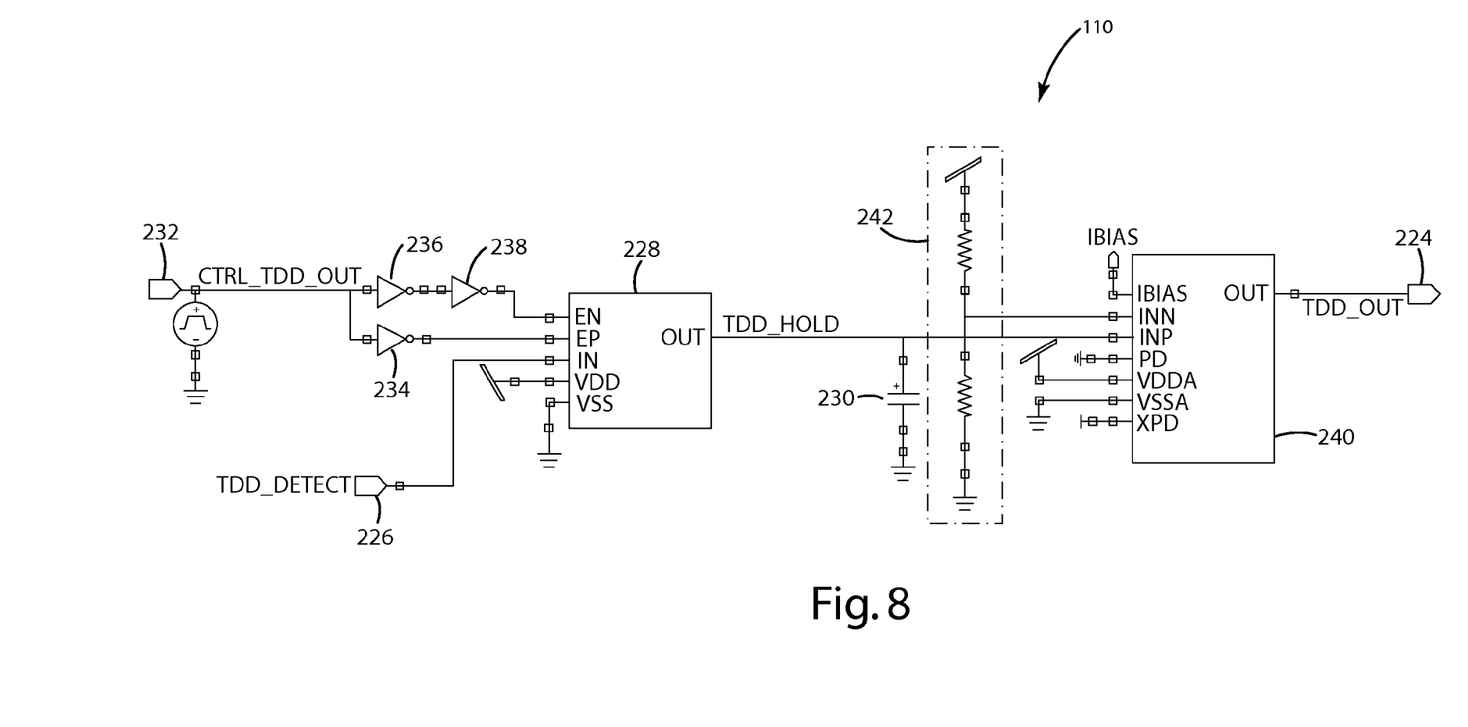
FIG. 8 is a is a circuit diagram of the second time domain differential latching buffer 110 of the measurement circuit of FIG. 3A.

Referring now to FIG. 8, the output terminal of the Time Domain Differential Measuring Circuit 108 is electrically coupled to the input terminal 226 of the Time Domain Differential Comparator Circuit 110. The Time Domain Differential Comparator Circuit input 226 is electrically coupled to a transmission gate 228, which operates to pass the input voltage to a 0.5 pF sample and hold capacitor 230. The transmission gate 228 operates via a control signal (labeled as CTRL_TDD_OUT) through inverters 234, 236 and 238. Transmission gate 228 includes electrical connections rail voltage (VDD), ground (VSS), and EN and EP which control operation of the transmission gate 228. If the control signal low, e.g., EN is negative and EP is positive, the transmission gate 228 does not pass the input voltage to the sample and hold capacitor 230. Conversely, if the control signal is high, e.g., EN is positive and EP is negative, the transmission gate 228 operates to pass the input voltage to the sample and hold capacitor 230. This resulting voltage stored in capacitor 230 (labeled as TDD_HOLD) is provided as the input to a comparator 240. The comparator 240 includes electrical connections to rail voltage (VDDA), ground (VSSA), bias (IBIAS), positive input (INP) and negative input (INN). In addition, XPD and PD are provided to disable the comparator 240, which remains in an "on" state in the present embodiment. The comparator 240 is operable to compare TDD_HOLD against a first predetermined reference value. A high reference value will require a greater rate of change (ds/dt) to generate an output, and likewise a lower reference value will require a lesser rate of change (ds/dt) to generate an output. A voltage divider 242 is connected between rail voltage and ground and is selected to provide a stable reference voltage to the comparator negative or inverting input (INN). When the non-inverting input (INP) is at a higher voltage than the inverting input (INN), the comparator output 244 (labeled as TDD_OUT) is high. Conversely, when the non-inverting input is at a lower voltage than the inverting input, the comparator output 224 is low. In the present embodiment, a high output can indicate an object is approaching the capacitive sensor 102 with a positive rate of change above a minimum reference value, while a low output can indicate an object has come to rest or nearly come to rest with respect to the capacitive sensor 102, or is receding away from the capacitive sensor 102.

Figure 9:
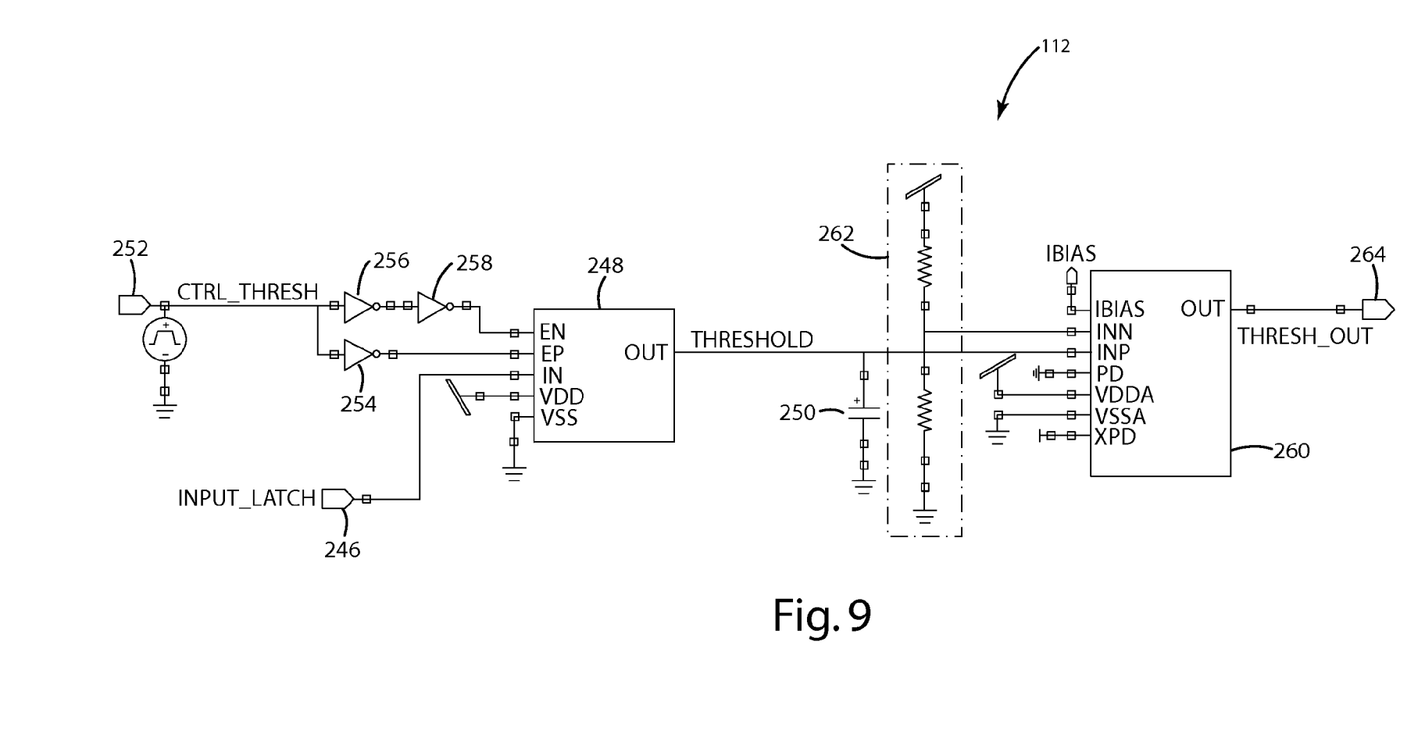
FIG. 9 is a circuit diagram of the threshold latching buffer 112 of the measurement circuit of FIG. 3A.

Referring now to FIG. 9, the measurement circuit 100 also includes a Stimulus Comparator Circuit 112 electrically coupled to the output 174 of the Input Latching Buffer 106. The Stimulus Comparator Circuit 112 is operable to compare the currently relevant Sense Input against a second reference value, as in shown decision step 56 of FIG. 2, to determine whether an object is within a predefined or proximate zone as earlier stated. The Stimulus Comparator Circuit input 246 is electrically coupled to a transmission gate 248, which operates to pass the input voltage to a 0.5 pF sample and hold capacitor 250. The transmission gate 248 operates in the manner as described above in response to a control signal (labeled as CTRL_THRESH) to isolate the transmission gate output from the corresponding input. The voltage provided to the sample and hold capacitor 250 is itself provided as the non-inverting input (INP) for a comparator 260, which compares the currently relevant Sense Input voltage against the second predetermined reference value. A second voltage divider 262 is connected between the rail voltage and ground to provide a stable threshold voltage to the comparator inverting input (INN). When the non-inverting input is at a higher voltage than the inverting input, the comparator output 264 (labeled as THRESH_OUT) is high. Conversely, when the non-inverting input is at a lower voltage than the inverting input, the comparator 260 output is low. In the present embodiment, a high output can indicate an object is proximate the capacitive sensor or within a predetermined zone, while a low output can indicate the absence of an object proximate the capacitive sensor, or outside of a predetermined zone, where the zone can be varied according to the user preferences as described above.

Figure 10:
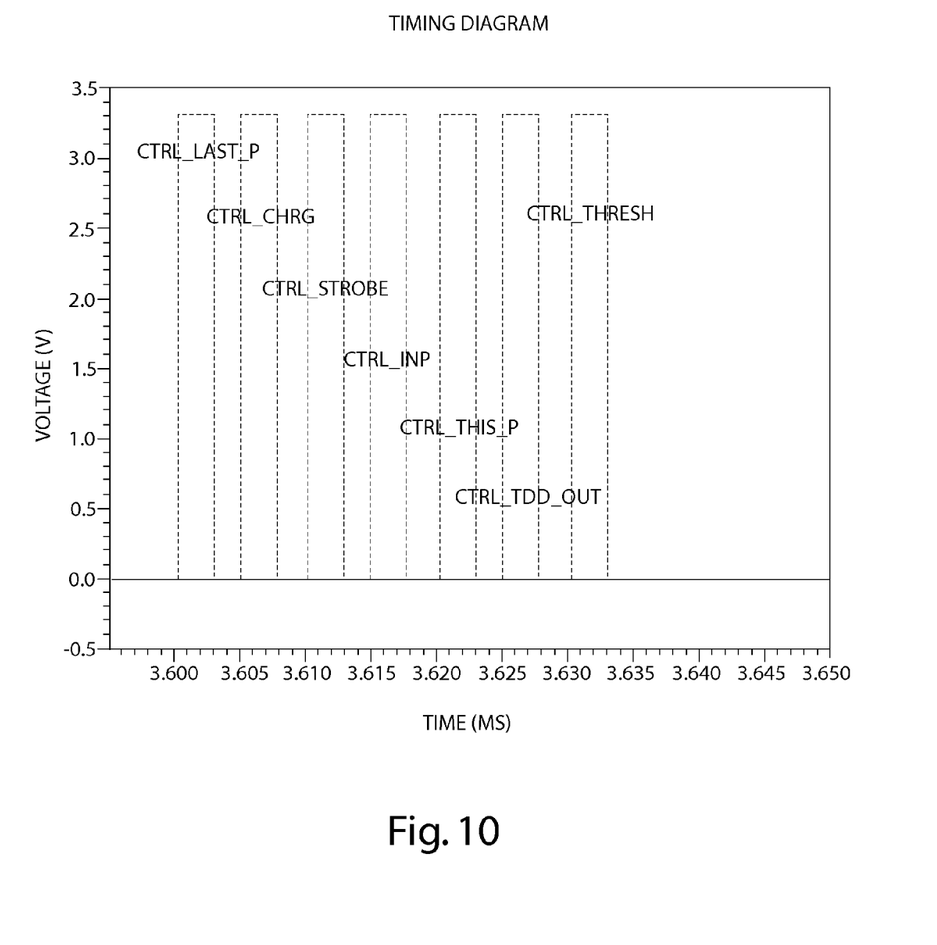
FIG. 10 is a timing diagram for the measurement circuit of FIG. 3A.

Sequencing of the control signals according to the present embodiment is illustrated in FIG. 10. Prior to a given scan interval, the timing interface circuit 101 provides a control signal (CTRL_LAST_P) at input 204 to charge sample and hold capacitor 190 in FIG. 7 with a value corresponding to Last Input at block 64 in FIG. 2. This waveform, like the remaining waveforms shown in FIG. 10, can include a 3.3 V peak voltage and a 3.0 µs pulse width. After a 2 µs interval, and beginning the present scan interval, the timing interface circuit 101 provides a control signal (CTRL_CHRG) to P-MOS active device 148 through inverter 146 to charge sample and hold capacitor 150 in FIG. 5 with a 3.3 V rail voltage. After a 2 µs interval, the timing interface circuit 101 provides a control signal (CTRL_STROBE) at input 142 to push pull drive 141, which causes N-MOS active device 134 to output a negative pulse at PK_OUT proportional to the capacitive sensor output 130. Negative peak detector transistor 152 and sample and hold capacitor 150 capture a voltage proportional to PK_OUT and hold that value (PK_DETECT_OUT) at the input of buffer 154. The voltage at sample and hold capacitor 150 is therefore buffered at output 156. After a 2 µs interval, timing interface circuit 101 provides a control signal (CTRL_INP) to input 175 in FIG. 6 to enable pass-through of the Stimulus Detector output 156 to sample and hold capacitor 162. In turn, the Input Latching Buffer output 174 out is applied across transmission gate 178 in FIG. 7. After a 2 µs interval, the timing interface circuit 101 provides a control signal (CTRL_THIS_P) to input 212 in FIG. 7, to charge sample and hold capacitor 192 with a voltage proportional to the Input Latching Buffer output for the present scan interval. The output of the Time Domain Differential Measuring Circuit 110 is then generated as described above to correspond to the rate of change of the capacitive sensor output with respect to time (ds/dt). After a 2 µs interval, timing interface circuit 101 provides a control signal (CTRL_TDD_OUT) to input 232 in FIG. 8 to charge sample and hold capacitor 230 with a voltage proportional to ds/dt for comparison with the first reference value in comparator 240. Lastly, timing interface circuit 101 provides a control signal (CTRL_THRESH) to input 252 of FIG. 9 to charge sample and hold capacitor 250 with a value proportional to the capacitive sensor output for comparison with the second reference value in comparator 260.

Figure 12:
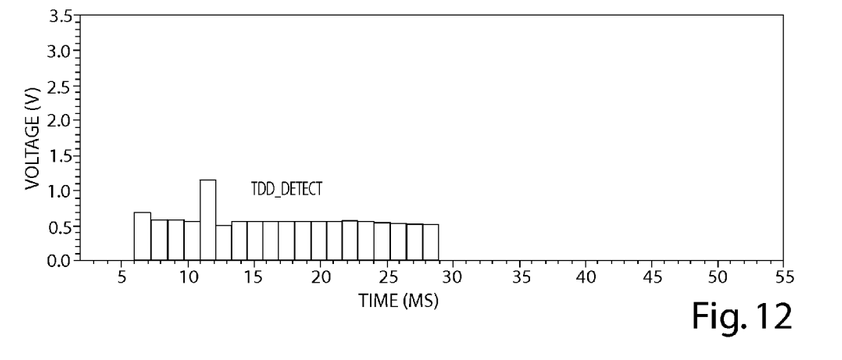
FIG. 12 is a voltage versus time graph illustrating the time differential output of the measurement circuit of FIG. 3A.
Figure 13:
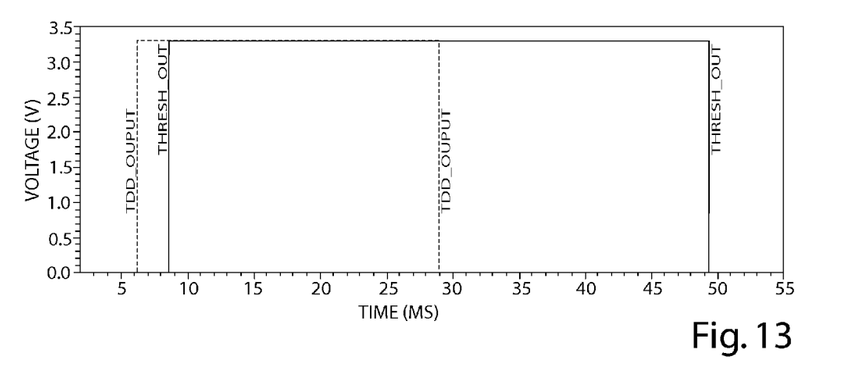
FIG. 13 is a voltage versus time graph illustrating the outputs of the measurement circuit of FIG. 3A.

Operation of the measurement circuit 100 can be further understood with reference to FIGS. 11-13. Beginning at time $T_0$, shown as 4 ms on the x-axis of FIGS. 11-12, capacitance is added and removed as described above in connection with FIG. 4, and as shown as the Stimulus Rate in FIG. 11. The insertion period is approximately 24 ms, followed by a like reduction in capacitance over an equal time period. The 48 ms period is selected to approximate the output of the capacitive sensor as a finger (i) approaches the touch substrate from an initial position beyond the effective range of the capacitive sensor, (ii) impacts the touch substrate, and (iii) returns to the initial position. As one of ordinary skill in the art will appreciate, the Stimulus Rate in FIG. 11 is an approximation, and may not precisely correlate to the capacitive sensor output in the presence of a human finger.

As also shown in FIG. 11, the Input Latching Buffer output (INPUT_LATCH) varies in inverse relation to the amount of capacitance detected as a finger approaches the touch surface. In particular, FIG. 11 illustrates a stepped decline in the Input Latching Buffer output from a nominal 2.3 V to 1.3 V. The stepped decline in the Input Latching Buffer output relates to movement of a finger from infinity to the touch substrate. In the present embodiment, the measurement circuit includes 1.2 ms scan intervals to sample the capacitive output at least twenty times over the 24 ms stimulus period. Alternatively, a 2.4 ms scan interval can be achieved to sample the capacitive output only ten times over the 24 ms period.

FIG. 12 illustrates the Time Domain Differential Latching Buffer output (TDD_DETECT) over time. As noted above, TDD_DETECT is proportional to the rate of change of the capacitive sensor output with respect to time, represented by k*ds/dt, where k is a constant related to the gain of the Time Domain Differential Measuring Circuit 108. As the Stimulus Rate increases over time to replicate movement of a finger from infinity to the touch substrate, TDD_DETECT remain approximately constant. However, as the Stimulus Rate approaches a peak value at 29 ms and declines to zero, the Time Domain Differential Comparator Output ceases to produce a discernible output voltage.

FIG. 13 illustrates the output of comparators 240 and 260, corresponding to the Time Domain Differential Comparator Circuit 110 and the Stimulus Comparator Circuit 112, respectively. At 6.0 ms, after only two scan intervals, the output of comparator 240 (TDD_OUTPUT) is high to indicate an object is approaching the capacitive sensor with a positive rate of change above a minimum, or first, reference value. Similarly, at approximately 8.5 ms, after approximately four scan intervals, the output of comparator 260 (THRESH_OUT) is high to indicate an object is proximate the capacitive sensor and within the proximity zone. At 29 ms, the output of comparator 240 is low, indicating an object has come to rest or nearly come to rest with respect to the capacitive sensor, or may be receding with respect to the capacitive sensor. Finally, at approximately 49 ms, the output of comparator 260 is low, indicating the absence of an object within the proximity zone. This output also indicates there has been a negative rate of change as the object receded from the capacitive sensor 102 to a position outside of the proximity zone. As noted above, TDD_OUTPUT and THRESH_OUT correspond to the output of decision steps 62 and 56, respectively, as described above in connection with FIG. 2. Accordingly, TDD_OUTPUT and THRESH_OUT can be utilized, for example, in digital logic in connection with the method discussed above in connection with FIG. 2 to determine presence of a proximate object based on the rate of change of the capacitive sensor output with respect to time.

While the above embodiments are described in connection with a capacitive sensor for detecting object proximity, the present invention can be applied to capacitive fluid level sensing, capacitive touch screens, capacitive slider input devices, capacitive speed sensors, capacitive distance sensors, or any other type of electric field sensing topology that can be reduced to a capacitor network equivalent where relative motion is applied and can generate a differential signal based on the rate of change of the capacitive sensor output with respect to time. In addition, the present invention can be applied to non-capacitive sensors, including, for example, one or more optical or magnetic sensors, to determine the proximity, speed or orientation of one or more objects relative to the optical or magnetic sensor.

Several additional benefits can accrue from the present invention. By utilizing the rate of change of the capacitive sensor output, a measurement circuit can determine a valid stimulus independent of variations in the substrate thickness, and independent of minor dielectric variations of an approaching object (e.g., a clothed versus a free hand). In addition, in touch sensor applications, the measurement circuit can adapt to user preferred sensitivity by registering touch inputs of varying degrees of force. For example, as a finger is applied with minimal pressure against the substrate, the measuring circuit will detect a valid stimulus event and register a touch soon after the rate of change of the sensor output falls to zero. In the same manner, as a finger is applied with greater pressure against the substrate, the measuring circuit will detect a valid stimulus event after the fingertip has come to rest and conformed itself to the substrate surface under greater pressure from the user. In this aspect, the invention adapts to user preferences in real time. Accordingly, the embodiments of the present invention provide multiple improvements.

The above descriptions are those of current embodiments of the invention. Various alterations and changes can be made without departing from the spirit and broader aspects of the invention as set forth in the following claims, which are to be interpreted in accordance with the principles of patent law including the Doctrine of Equivalents.

The invention claimed is:

1. A capacitive sensor to determine a touch input on a substrate, comprising:
   an electrode including a capacitance; and
   a processing unit electrically coupled to the electrode and configured to:
   measure the electrode capacitance, and
   determine the rate of change of the electrode capacitance in response to the electrode capacitance achieving a predetermined setpoint value to indicate the presence of an object in proximity to the substrate, wherein a touch input is determined based on a comparison of the rate of change of the electrode capacitance and a predetermined threshold value.

2. The capacitive sensor of claim 1 wherein the touch input corresponds to the placement of the object against the substrate.

3. The capacitive sensor of claim 1 wherein the touch input is determined in response to the rate of change of the electrode capacitance declining to less than the predetermined threshold value.

4. The capacitive sensor of claim 1 wherein the processing unit is configured to determine a latched value proportional to the electrode capacitance is greater than a second predetermined value.

5. The capacitive sensor of claim 1 wherein the processing unit includes a differential amplifier for providing an output proportional to the rate of change of the electrode capacitance.

6. The capacitive sensor of claim 5 wherein the differential amplifier is operative to compare first and second latched values corresponding to successive measurements of the electrode capacitance.

7. The capacitive sensor of claim 6 further including a first comparator operative to compare a signal proportional to the output of the differential amplifier with the threshold value.

8. The capacitive sensor of claim 7 wherein the processing unit includes a second comparator operative to compare a signal proportional to the electrode capacitance with the setpoint value.

9. The capacitive sensor of claim 8 wherein the processing unit determines the presence of the touch input based on the output of the first and second comparators.

10. The capacitive sensor of claim 1 wherein the processing unit is configured to distinguish between a first rate of change of the electrode capacitance and a second rate of change of the electrode capacitance, wherein the first and second rate of change of electrode capacitance correspond to at least one touch input.

11. The capacitive sensor of claim 1 wherein the processing unit is configured to filter electromagnetic interference based on the rate of change of the electrode capacitance.

12. The capacitive sensor of claim 11 wherein the processing unit is configured to filter electromagnetic interference when the rate of change of the electrode capacitance exceeds a maximum value.

13. The capacitive sensor of claim 1 wherein the processing unit is configured to distinguish between a first rate of change of the electrode capacitance and a second rate of change of the electrode capacitance to filter electromagnetic interference.

14. The capacitive sensor of claim 1 wherein the processing unit is configured to filter gradual changes in capacitance when the rate of change of the electrode capacitance is less than a minimum value.

15. The capacitive sensor of claim 14 wherein the gradual changes relate to changes in the ambient environment.

16. A method for detecting a touch input comprising:
   providing a capacitive sensor, the capacitive sensor including an output;
   measuring the capacitive sensor output;
   detecting an object in proximity to the capacitive sensor based on the absolute value of the capacitive sensor output exceeding a setpoint value;
   in response to the detecting step, measuring a rate of change of the capacitive sensor output; and
   determining the presence of a touch input based on a comparison of the rate of change of the capacitive sensor output and a predetermined threshold value.

17. The method according to claim 16 wherein measuring the rate of change includes detecting, over successive sampling intervals, a variation in the capacitive sensor output.

18. The method according to claim 16 wherein the presence of the touch input is further based on the rate of change of the capacitive sensor output declining to less than the predetermined threshold value.

19. The method according to claim 16 further including providing a substrate adjacent the capacitive sensor, wherein the touch input corresponds to the placement of the object against the substrate.

20. A capacitive touch system comprising:
a plurality of electrodes responsive to a touch by a human operator to generate a change in capacitance at each electrode;
a dielectric substrate adjacent the plurality of electrodes; and
a measurement circuit coupled to each of the plurality of electrodes and configured to:
measure the capacitance at each electrode,
measure the change in capacitance at each electrode,
determine the rate of change of at least one electrode capacitance in response to the electrode capacitance achieving a predetermined setpoint value to indicate proximity of a touch to the dielectric substrate, wherein the touch input is determined based on a comparison of the determined rate of change and a predetermined threshold value.

21. The capacitive touch system of claim 20 wherein the measurement circuit includes:
a differential amplifier operative to compare first and second latched values corresponding to successive measurements of the electrode capacitance; and
a first comparator operative to compare the output of the differential amplifier with the predetermined threshold value.

22. The capacitive touch system of claim 21 wherein the measurement circuit further includes a second comparator operative to compare a signal proportional to the electrode capacitance with the predetermined setpoint value.

23. The capacitive touch system of claim 22 wherein the presence of a touch input is based on the output of the first and second comparators.

24. The capacitive touch system of claim 20 wherein the comparison includes determining that the rate of change of the electric capacitance declined to less than the predetermined threshold value.

25. A method of detecting a touch input on an input surface comprising:
providing a capacitive sensor, the capacitive sensor including an output;
measuring the capacitive sensor output;
detecting an object is in proximity to the input surface based on the capacitive sensor output exceeding a set-point value;
in response to the detecting step, monitoring the rate of change of the capacitive sensor output; and
determining the presence of the object on the input surface based on a comparison of the rate of change of the capacitive sensor output and a predetermined threshold value.

26. The method of claim 25 wherein the object comprises a finger.

27. The method of claim 25 wherein the determining step includes determining the rate of change has fallen below the predetermined threshold value.

28. An apparatus for detecting a touch input on an input surface comprising:
an electrode outputting a first signal indicative of a distance between an object and the input surface; and
a processor electrically coupled to the electrode and adapted to:
compare the first signal to a setpoint value, and
monitor the rate of change of the first signal in response to the first signal being greater than the setpoint value, the processor outputting a second signal in response to a comparison of the rate of change of the first signal to a predetermined threshold value to indicate a touch input on the input surface.

29. The apparatus of claim 28 wherein the object comprises a finger.

30. The apparatus of claim 28 wherein the touch input corresponds to the rate of change as falling below the predetermined threshold value.

* * * * *